United States Patent
Pan et al.

(10) Patent No.: US 7,374,958 B2
(45) Date of Patent: May 20, 2008

(54) LIGHT EMITTING SEMICONDUCTOR BONDING STRUCTURE AND METHOD OF MANUFACTURING THE SAME

(75) Inventors: Shyi-Ming Pan, Chang-Hua (TW); Fen-Ren Chien, Yung-Ho (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 129 days.

(21) Appl. No.: 11/380,209

(22) Filed: Apr. 26, 2006

(65) Prior Publication Data
US 2006/0199290 A1   Sep. 7, 2006

Related U.S. Application Data

(62) Division of application No. 10/966,537, filed on Oct. 15, 2004, now abandoned.

(51) Int. Cl.
*H01L 21/00* (2006.01)
*H01L 21/44* (2006.01)
*H01L 33/00* (2006.01)
*H01L 20/22* (2006.01)
*H01L 27/15* (2006.01)
*H01L 29/267* (2006.01)

(52) U.S. Cl. ............ 438/22; 438/24; 438/612; 438/618; 257/99; 257/81; 257/79; 257/E33.001; 257/E33.002

(58) Field of Classification Search ............... 438/22, 438/24, 612, 618; 257/99, 81, 79, E33.001, 257/E33.002
See application file for complete search history.

(56) References Cited

U.S. PATENT DOCUMENTS

| 6,900,474 B2 * | 5/2005 | Misra et al. ........... 257/98 |
| 2002/0123164 A1 * | 9/2002 | Slater et al. ........... 438/39 |

\* cited by examiner

*Primary Examiner*—Luan Thai

(57) ABSTRACT

A light emitting semiconductor bonding structure includes a structure formed by bonding a substrate onto a light emitting semiconductor. The substrate is a structure containing electric circuits. The ohmic contact N electrode layer and P electrode layer are formed on the N-type contact layer and the P-type contact layer of the light emitting semiconductor respectively. A first metallic layer and a second metallic layer are formed on the surface of the substrate by means of immersion plating or deposition. The metallic layers are connected electrically to the corresponding electric signal input/output nodes of the electric circuit of the substrate. The first metallic layer and the second metallic layer are bonded onto the N electrode layer and the P electrode layer respectively through supersonic welding, and as such the light emitting semiconductor is bonded onto the substrate, and thus realizing the electric connection in-between.

4 Claims, 3 Drawing Sheets

LIGHT EMITTING SEMICONDUCTOR BONDING STRUCTURE AND METHOD OF MANUFACTURING THE SAME

CROSS-REFERENCES TO RELATED APPLICATIONS

This is a division of U.S. application Ser. No. 10/966,537, filed Oct. 15, 2004 now abandoned.

BACKGROUND OF THE INVENTION

1. Field of the Invention

The present invention relates to a light emitting semiconductor bonding structure and its manufacturing method, and in particular to a light emitting semiconductor structure bonded on a substrate for creation of electric connection therebetween.

2. The Prior Arts

In the conventional method of producing light emitting semiconductor bonding structures, a light emitting semiconductor is bonded onto an electrically controlled substrate through the ordinary flip chip process. FIG. 3 of the attached drawings shows a conventional light emitting semiconductor bonding structure, which is obtained by bonding a substrate 301 to a light emitting semiconductor 302. The substrate 301 is a structure containing electric circuits, and the light emitting semiconductor 302 is a light emitting diode. Taking the gallium-nitride (GaN) based light emitting diode as an example, the light emitting semiconductor 302 comprises an N-type contact layer 303 and a P-type contact layer 304. The N type contact layer 303 is made of N-type gallium-nitride, and an ohmic contact N electrode layer 303a is formed on one exposed side, and a first metallic bump 303b is formed on the N electrode layer 303a. The P type contact layer 304 is made of P-type gallium-nitride, an ohmic contact P electrode layer 304a is formed on one exposed side, and a second metallic bump 304b is formed on the P electrode layer 304a. Therefore, the light emitting semiconductor 302 can be welded on the substrate 301 through the first metallic bump 303b and the second metallic bump 304b by means of the Flip Chip Bonder, and as thus accommodating the input/output of the electric signals between the substrate 301 and the light emitting semiconductor 302. However, if the metallic bump is made of solder, it is not suitable for the high temperature manufacturing process and the application of the high power light emitting diode (LED) because the melting point of the solder is too low. Besides, although the gold bump process can be used for the metallic bump to overcome the shortcomings of using the solder, yet by doing so, it would require the additional Au Bump Process. In addition, in the application of Gold Bump Process, the number of gold bumps will determine the effectiveness of heat dissipation, and resulting in the increase of its production cost due to the gold bump process required for the high power light emitting diode, and thus reducing its production yield.

Therefore, the development and realization of the present invention is based on the effort to overcome the shortcomings and disadvantages of the conventional light emitting semiconductor bonding structure.

SUMMARY OF THE INVENTION

The present invention relates to a light emitting semiconductor bonding structure and its manufacturing method, and it practically solves one or even several shortcomings and restrictions of the aforementioned related prior art.

The purpose of the present invention is to adopt the entire surface metallic layer bonding rather than the partial surface bonding at the junction of the light emitting semiconductor and the substrate, such that in the bonding process, it needs only to cooperate with the Flip Chip Bonder, and there is no need to produce the Au bumps. Therefore, this kind of entire surface bonding can not only provide the solid and strong bonding, more even current distribution, better heat dissipation, increased reliability, but can also further reduce its production cost and raise its production yield.

To achieve the aforementioned purpose, the present invention provides a light emitting semiconductor bonding structure and its manufacturing method, and the realization of the present invention is achieved mainly through the structure obtained by bonding the substrate onto the light emitting semiconductor. In addition, the substrate is a structure containing electric circuits, and an ohmic contact N electrode layer and P electrode layer are formed on the N-type contact layer and P-type contact layer in the light emitting semiconductor respectively; and the first metallic layer and the second metallic layer are formed on the surface of the substrate through the immersion-plating or deposition. The metallic layers are connected electrically to the corresponding electric signal input/output nodes of the substrate electric circuit respectively. The first metallic layer and the second metallic layer are in cooperation with the N electrode layer and P electrode layer of the light emitting semiconductor respectively so that the first metallic layer and the second metallic layer correspond to and are bonded onto the N electrode layer and P electrode layer respectively through ultra-sonic welding, so that the light emitting semiconductor is bonded onto the substrate, and thus realizing the electric connection in-between.

The purpose and functions of the present invention can be understood more thoroughly through the following detailed description together with the attached drawings.

BRIEF DESCRIPTION OF THE DRAWINGS

The related drawings in connection with the detailed description of the present invention to be made later are described briefly as follows, in which.

DETAILED DESCRIPTION OF THE PREFERRED EMBODIMENT

A preferred embodiment of the present invention will be described in more detail further together with the attached drawings, wherein certain scales and the related scales of other portions are exaggeratedly enlarged to provide more clear description, so as to facilitate the people familiar with this technology to have a better understanding of the present invention.

Figure 1:
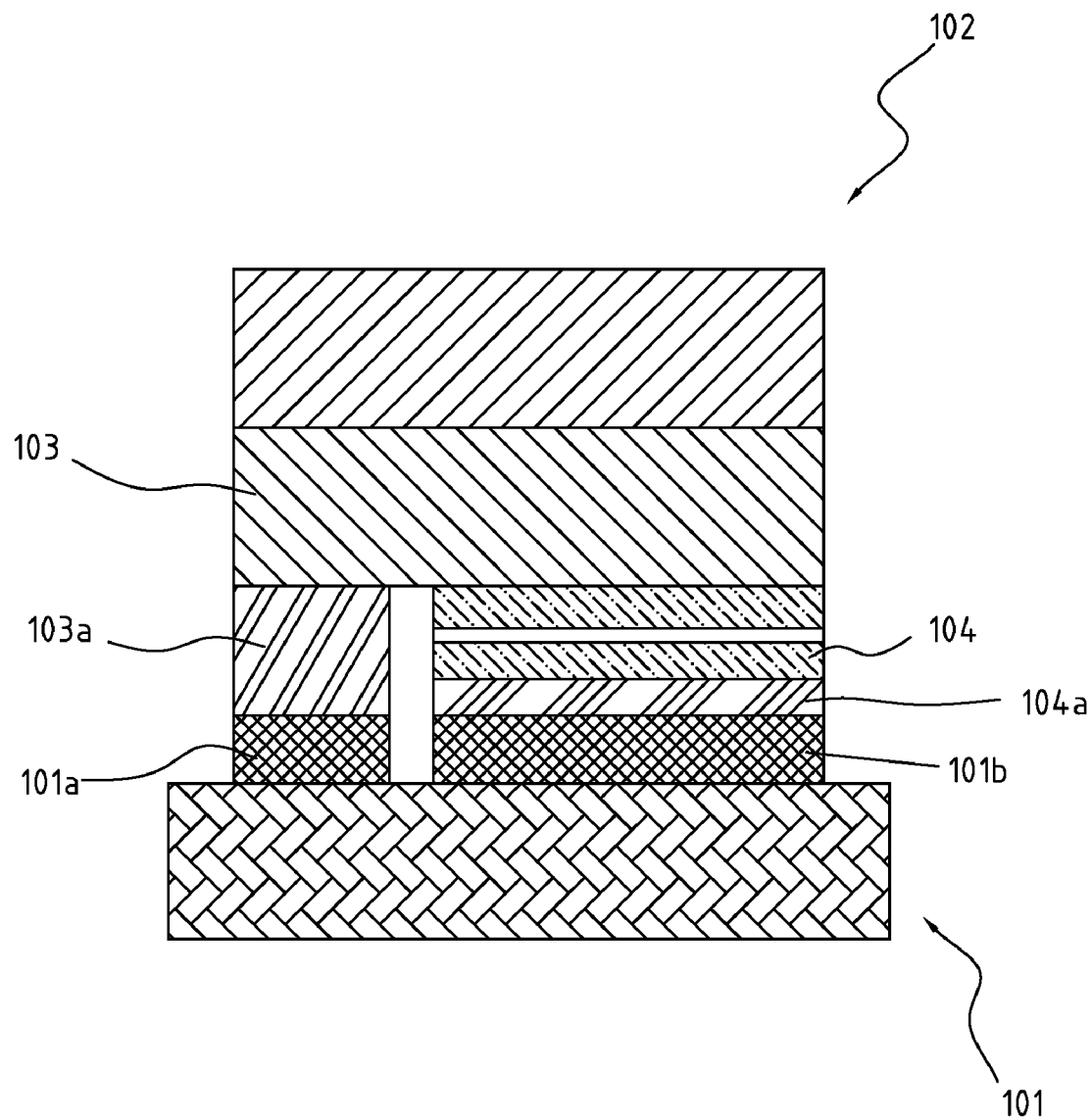
FIG. 1 is a light emitting semiconductor bonding structure according to the preferred embodiment of the present invention.
Figure 2:
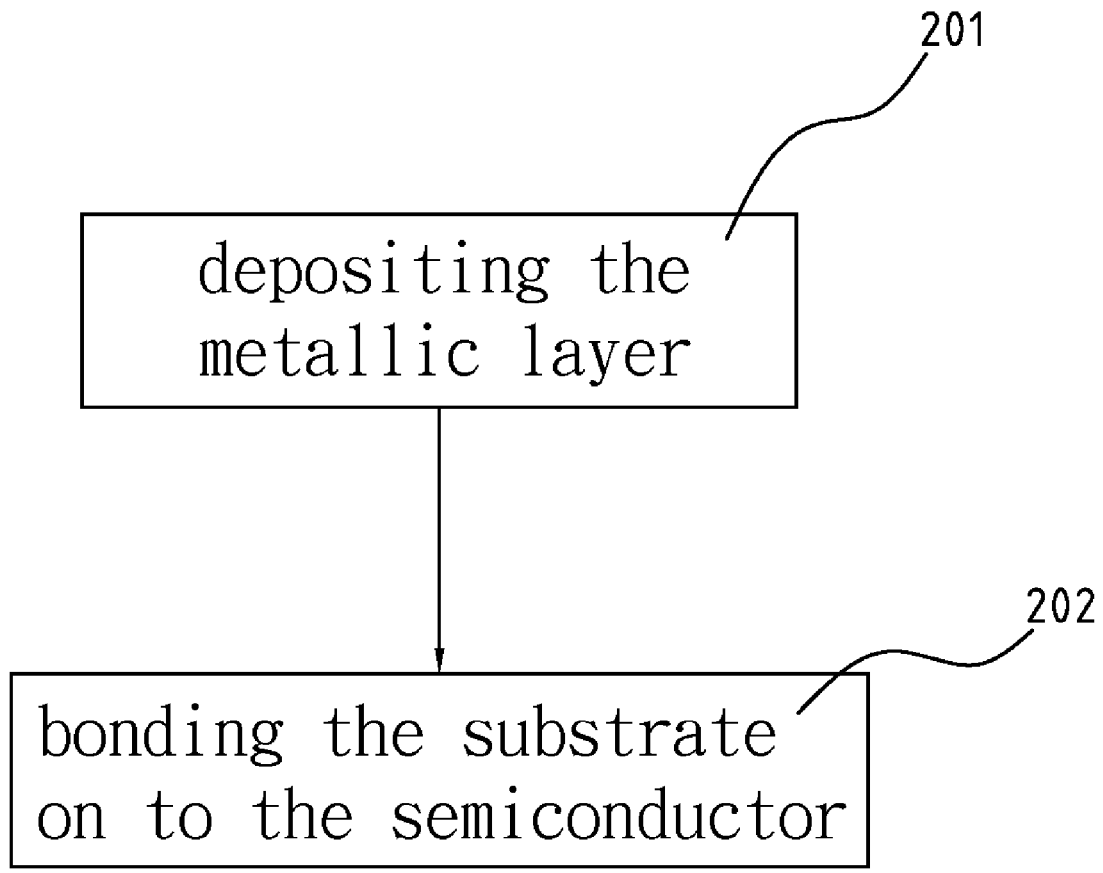
FIG. 2 is a flowchart of a method realizing the structure in FIG. 1 according to the preferred embodiment of the present invention.
Figure 3:
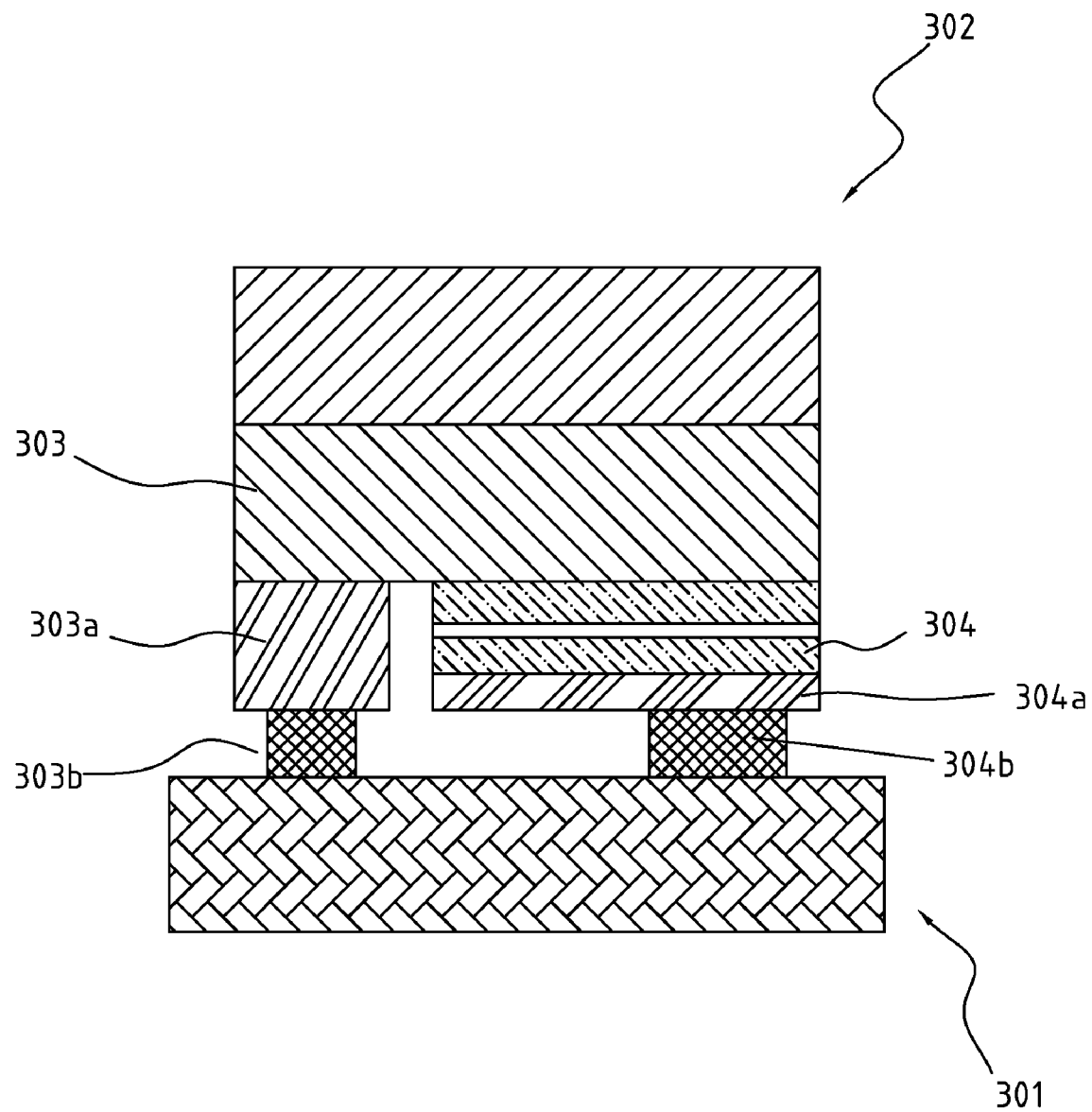
FIG. 3 is a conventional light emitting semiconductor bonding structure.

FIG. 1 is the schematic section view of the light emitting semiconductor bonding structure according to the preferred embodiment of the present invention. FIG. 2 is the flowchart of the method of realizing the structure in FIG. 1 according to the preferred embodiment of the present invention.

First, please refer to FIG. 1, which indicates the preferred embodiment of the light emitting semiconductor bonding structure of the present invention. This structure is realized through bonding the substrate 101 onto the light emitting semiconductor 102.

The substrate 101 is a structure containing electric circuits, and at least a first metallic layer 101a and a second metallic layer 101b are formed on its surface. The first metallic layer 101a and second metallic layer 101b are connected electrically to the corresponding electric signal input/output nodes of the electric circuit of the substrate 101, and thus accommodating the input/output of the electric signals between the substrate 101 and light emitting semiconductor 102.

A lead frame is provided on the substrate 101, which is used to connect electrically to the light emitting semiconductor 102, so as to accommodate the input/output of electric signal from/to the light emitting semiconductor 102.

In addition, the light emitting semiconductor 102 in reality is a light emitting diode, for example, a gallium-nitride (GaN) based light emitting diode. The light emitting semiconductor 102 includes an N-type contact layer 103 and a P-type contact layer 104. The N-type contact layer 103 is made of N-type gallium-nitride, and an ohmic contact N electrode layer 103a is formed on one of its exposed sides; and the P-type contact layer 104 is made of P-type gallium-nitride, and an ohmic contact P electrode layer 104a is formed on one of its exposed sides.

The first metallic layer 101a and the second metallic layer 101b of the substrate 101 are bonded to N electrode layer 103a and P electrode layer 104a of the light emitting semiconductor 102 respectively so that the light emitting semiconductor 102 is bonded onto the substrate 101, and thus realizing the electric connection in-between. The areas of said first metallic layer 101a and the second metallic layer 101b correspond to those of the N electrode layer 103a and P electrode layer 104a respectively so as to form the contact areas of approximately the same size.

Next, please refer to FIG. 2. FIG. 2 is the flowchart of the method used in realizing the light emitting semiconductor bonding structure of FIG. 1 according to the preferred embodiment of the present invention, comprising the following steps:

Step 201: forming the first metallic layer 101a and the second metallic layer 101b on the corresponding positions of the substrate 101 so that the areas and positions of the first metallic layer 101a and the second metallic layer 101b correspond to those of the N electrode layer 103a and the P electrode layer 104a.

Step 202: flip-placing the light emitting semiconductor 102 on the substrate 101 so that the N-electrode 103a and P-electrode 104a correspond to and are stacked on the first metallic layer 101a and the second metallic layer 101b, and then through the ultra-sonic welding, bonding the N electrode layer 103a onto the first metallic layer 101a, and bonding the P electrode layer 104a onto the second metallic layer 101b. As such, the light emitting semiconductor 102 can be bonded onto the substrate 101, and thus realizing the electric connection in-between.

In the aforementioned steps, the first metallic layer 101a and the second metallic layer 101b are formed on the substrate 101, this is achieved by means of the ordinary metal deposition method in addition to the immersion plating method. Its major essence is to form the first metallic layer 101a and the second metallic layer 101b on the substrate 101 so that the areas and positions of the first metallic layer 101a and the second metallic layer 101b correspond to those of the N electrode layer 103a and the P electrode layer 104a.

The deposition of the first metallic layer 101a and the second metallic layer 101b can also be achieved by means of the ordinary metallic deposition, such as the physical vapor deposition (PVD), chemical vapor deposition (CVD), and electroplating.

The first metallic layer 101a and the second metallic layer 101b of the present invention connect the electric circuit of substrate 101 to the N electrode layer 103a and P electrode layer 104a of the light emitting semiconductor 102. They form the junction interface between the electric signal input/output node in the electric circuit of the substrate 101 and the N electrode layer 103a and the P electrode layer 104a of the light emitting semiconductor 102. Therefore, the invention is not restricted to depositing the first metallic layer 101a and the second metallic layer 101b on the substrate 101, and the metallic layers can also be deposited on the surface of the N electrode layer 103a and the P electrode layer 104a.

The preferred Embodiment described above is only illustrative, and it is not intended to be construed as to be any restrictions to the present invention. Therefore, any variations or modifications made within the spirit and scope of the present invention can be included in the scope of protection of the present invention.

What is claimed is:

1. A light emitting semiconductor bonding method for bonding a substrate onto a light emitting semiconductor, the substrate being a structure containing electric circuits, an ohmic contact N electrode layer and an ohmic contact P electrode layer being formed on an N-type contact layer and a P-type contact layer of the light emitting semiconductor respectively, and the method comprising the following steps:

(a) depositing and forming a first metallic layer and a second metallic layer on the substrate with positions of the first metallic layer and the second metallic layer corresponding to those of the N electrode layer and the P electrode layer; and (b) flip-placing the light emitting semiconductor on the substrate so that the N electrode layer and the P electrode layer correspond to and are stacked on the first metallic layer and the second metallic layer, and then bonding the N electrode layer onto the first metallic layer and bonding the P electrode layer onto the second metallic layer by using ultra-sonic welding technology; wherein the areas of the first metallic layer and the second metallic layer correspond to those of the N electrode layer and the P electrode layer so as to form contact areas of approximately the same size.

2. The light emitting semiconductor bonding method as claimed in claim 1, wherein the first metallic layer and the second metallic layer correspond to the electric circuit of the substrate and the N electrode layer and the P electrode layer of the light emitting semiconductor, and junction interfaces are deposited on the surfaces of the N electrode layer and the P electrode layer, and are formed between an electric signal input/output node in the electric circuit of the substrate and the N electrode layer and the P electrode layer of the light emitting semiconductor.

3. The light emitting semiconductor bonding method as claimed in claim 1, wherein the first metallic layer and the second metallic layer are formed on the substrate by means of immersion-plating.

4. The light emitting semiconductor bonding method as claimed in claim 1, wherein ordinary metal deposition methods are utilized to form the first metallic layer and the second metallic layer on the substrate, the ordinary metal deposition methods including physical vapor deposition (PVD), chemical vapor deposition (CVD), or electroplating.

* * * * *